US 6,620,712 B2

(12) United States Patent
Huang et al.

(10) Patent No.: US 6,620,712 B2
(45) Date of Patent: Sep. 16, 2003

(54) DEFINED SACRIFICAL REGION VIA ION IMPLANTATION FOR MICRO-OPTO-ELECTRO-MECHANICAL SYSTEM (MOEMS) APPLICATIONS

(75) Inventors: Liji Huang, San Jose, CA (US); Naiqian Han, Cupertino, CA (US); Yahong Yao, Cupertino, CA (US); Gaofeng Wang, Sunnyvale, CA (US)

(73) Assignee: INTPAX, Inc., Cupertino, CA (US)

( * ) Notice: Subject to any disclaimer, the term of this patent is extended or adjusted under 35 U.S.C. 154(b) by 89 days.

(21) Appl. No.: 10/011,350

(22) Filed: Nov. 12, 2001

(65) Prior Publication Data

US 2002/0110948 A1 Aug. 15, 2002

Related U.S. Application Data

(60) Provisional application No. 60/268,614, filed on Feb. 14, 2001.

(51) Int. Cl.$^7$ ............................................. H01L 21/00
(52) U.S. Cl. .................... 438/519; 438/29; 438/31; 438/45; 438/48; 438/480; 438/506; 438/510; 438/514; 438/519; 438/527; 438/529; 257/98; 385/1; 385/2; 385/14; 385/129; 385/130; 385/131
(58) Field of Search ........................... 438/510–529, 438/480, 16, 506, 22–23, 29, 31, 45, 48, 50–53; 257/98; 385/1–3, 14, 129–131

(56) References Cited

U.S. PATENT DOCUMENTS

| | | | | |
|---|---|---|---|---|
| 3,864,023 A | * | 2/1975 | Glaser et al. | 350/160 |
| 4,166,669 A | * | 9/1979 | Leonberger et al. | 350/96.13 |
| 5,004,313 A | * | 4/1991 | Ty Tan et al. | 350/96.14 |
| 5,165,105 A | * | 11/1992 | Haase et al. | 385/8 |
| 5,359,679 A | * | 10/1994 | Tanaka et al. | 385/8 |
| 5,825,524 A | * | 10/1998 | Faderl et al. | 359/245 |

(List continued on next page.)

FOREIGN PATENT DOCUMENTS

GB          2190212     * 5/1987     ........... G02F/1/015

OTHER PUBLICATIONS

Gorecki et al. "The role of fiber sensing technologies in MEMS/Moems" optical fiber sensors conference Tech Digest, 2002 pg. 339–342 vol. 1.*

(List continued on next page.)

Primary Examiner—Matthew Smith
Assistant Examiner—Granvill D Lee
(74) Attorney, Agent, or Firm—Bo-In Lin

(57) ABSTRACT

The present invention discloses an electro-optical device support on a substrate. The electro-optical device includes a sacrificial layer disposed on the substrate having a chamber-wall region surrounding and defining an optical chamber. The electro-optical device further includes a membrane layer disposed on top of the sacrificial layer having a chamber-removal opening surrounding and defining an electric tunable membrane for transmitting an optical signal therethrough. The electrically tunable membrane disposed on top of the optical chamber surrounded by the chamber wall regions. The chamber-wall region is doped with ion-dopants for maintaining the chamber-wall region for removal-resistance under a chamber-forming process performed through the chamber-removal opening. In a preferred embodiment, the chamber-wall region is a doped silicon dioxide region with carbon or nitrogen. In another preferred embodiment, the chamber-wall region is a nitrogen ion-doped SiNxOy region. In another preferred embodiment, the optical chamber is an etched chamber formed by etching through the chamber removal opening for etching off an etch-enhanced region surrounded by an etch-resistant region constituting the chamber wall.

26 Claims, 7 Drawing Sheets

U.S. PATENT DOCUMENTS

| | | | | |
|---|---|---|---|---|
| 5,825,525 A | * | 10/1998 | Harwit | 359/248 |
| 6,525,352 B1 | * | 2/2003 | Muller et al. | 257/252 |
| 2002/0009264 A1 | * | 1/2002 | Koteles et al. | 385/43 |
| 2002/0080465 A1 | * | 6/2002 | Han et al. | 359/291 |
| 2002/0102056 A1 | * | 8/2002 | Koehl et al. | 385/40 |
| 2002/0159667 A1 | * | 10/2002 | Van Eck et al. | 385/2 |
| 2003/0021571 A1 | * | 1/2003 | Lian et al. | 385/137 |

OTHER PUBLICATIONS

Nee et al. "Stretched–film micromirrows for improved optical flatness" Micro–electro–mechanical systems 2000 Mems 2000 13 th annual pg. 704–709.*

Eui–Hyeck yang et al. "A new wafer–level membrane transfer technique for MEMS deformable mirrors" Micro Electro Mechanical Systems, 2001. MEMS 2001. The 14th IEEE International Conference on, 2001 p. 80–83.*

Aratani et al. "Process and design considerations for surface micromachined beams for a tuneable interferometer array in silicon" Micro Electro Mechanical Systems, 1993, MEMS '93, Proceedings An Investigation of Micro System . . . IEEE Feb. 1993 p. 230–235.*

* cited by examiner

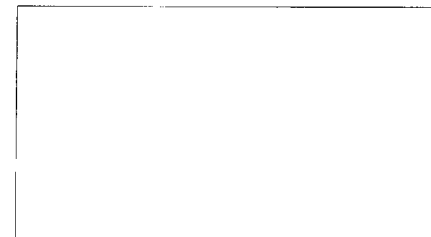
Fig 2A-1    Fig 2A-2
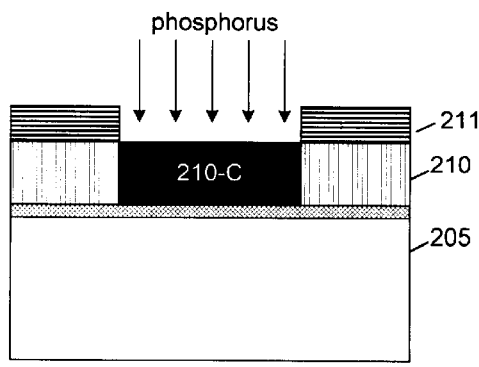
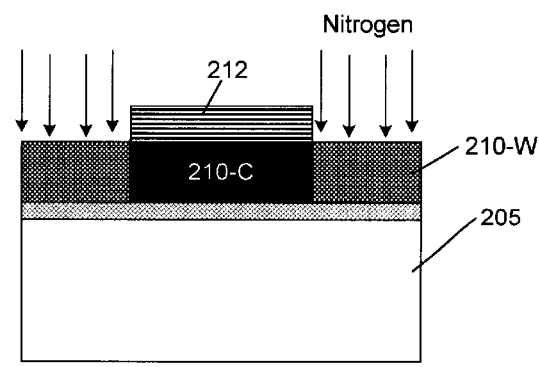
Fig. 2A-3    Fig. 2A-4
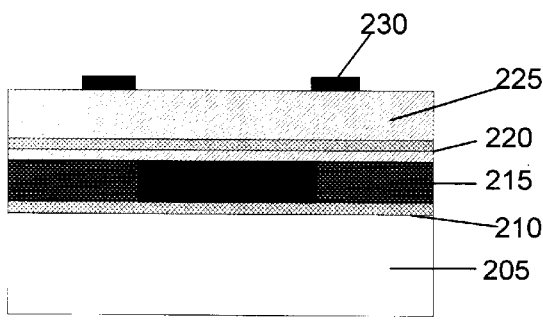
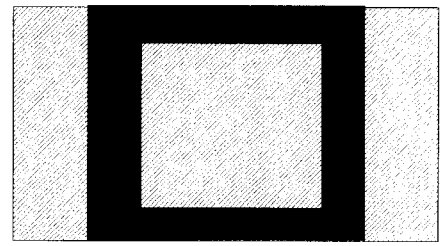
Fig 2B-1    Fig 2B-2

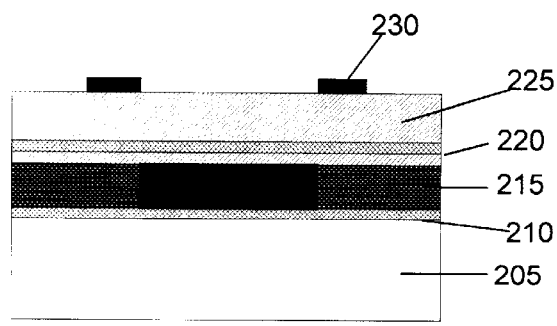
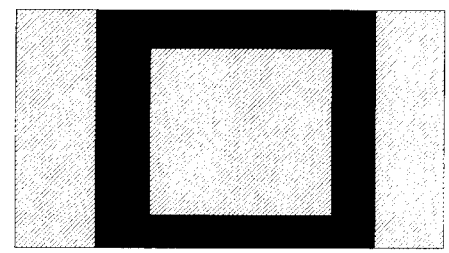
Fig 2C-1
Fig 2C-2
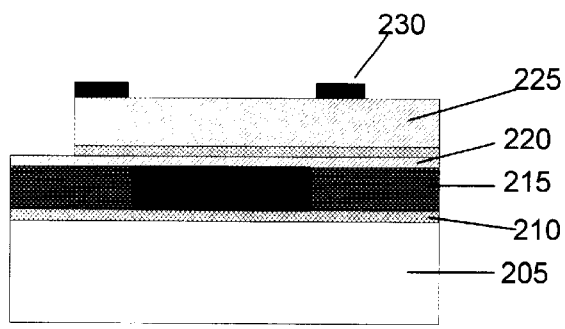
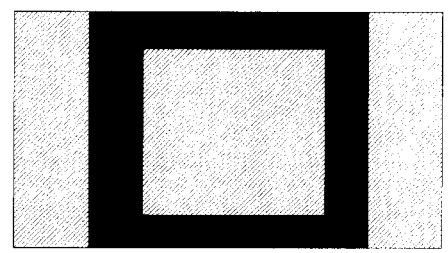
Fig 2D-1
Fig 2D-2
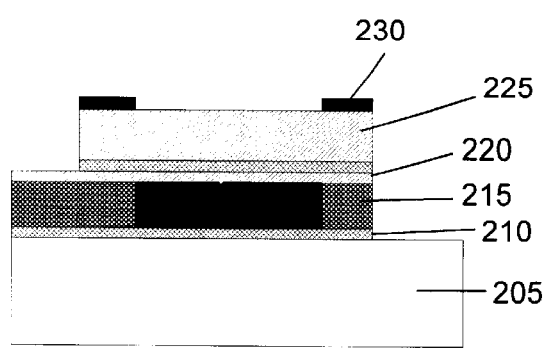
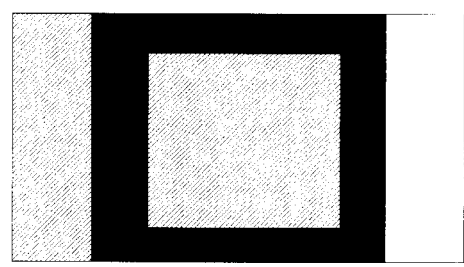
Fig 2E-1
Fig 2E-2

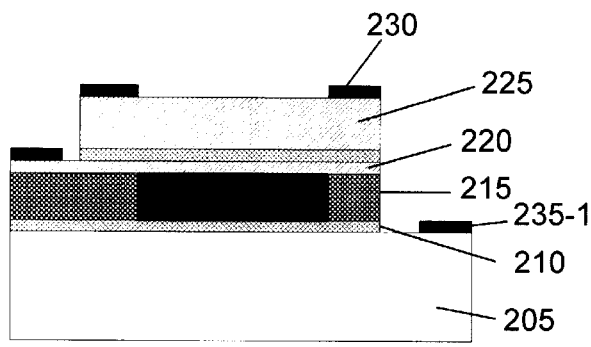
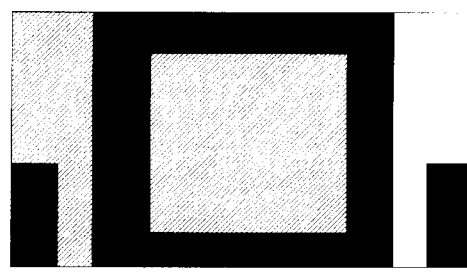
Fig 2F-1　　　　　　　　Fig 2F-2
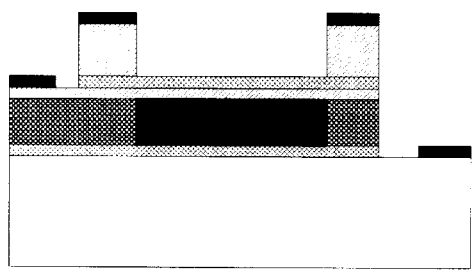
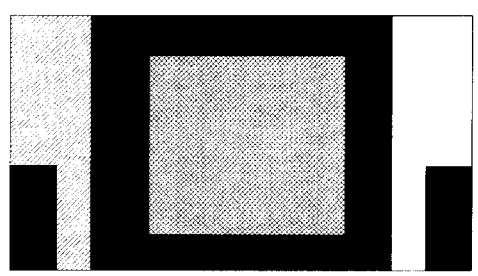
Fig 2G-1　　　　　　　　Fig 2G-2
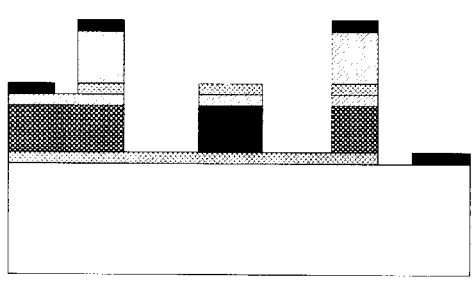
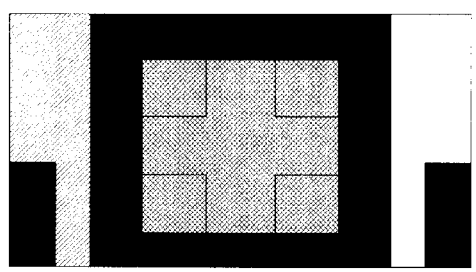
Fig 2H-1　　　　　　　　Fig 2H-2

US 6,620,712 B2

DEFINED SACRIFICAL REGION VIA ION IMPLANTATION FOR MICRO-OPTO-ELECTRO-MECHANICAL SYSTEM (MOEMS) APPLICATIONS

This Application claims a priority date of Feb. 14, 2001 benefited from a previously filed Provisional Patent Application 60/268,614 filed on Feb. 14, 2001 by one of the Applicants of this Formal Patent Application.

BACKGROUND OF THE INVENTION

1. Field of the Invention

This invention relates generally to apparatus and methods for manufacturing optical and photonic devices by employing the micro-opto-electro-mechanical system (MOEMS) technologies. More particularly, this invention is related to configuration and method of manufacturing optical devices by applying MOEMS technologies with defined sacrificial region by ion-implantation.

2. Description of the Related Art

Recent development of the is still faced with a technical limitation that the optical chamber etched on a sacrificial layer is often etched with irregularities and undercut when dry or wet etching processes are applied. Current manufacturing processes apply a surface micro-machining technique that uses oxide or phosphorous doped silicate glass (PSG) as the sacrificial etch materials Meanwhile, the sacrificial etch layer composed of the PSG material is also implemented as structural elements in the optical device formed as the chamber poles. A typical example is the optical modulators implemented with the configuration of a mechanical anti-reflection (MAR) switch. The manufacture irregularities produced by applying the dry or wet etching processes and using the conventional sacrificial etch materials adversely affect the production yields and the switching/attenuation performance and also the reliability of the devices. The next generation broadband optical communication system requires significant scale-down of size and reduction in production costs from current standards based on technology of devices by mechanically assembling optical components. Recent development of silicon based optical single switch modulator and integrated multiple-channel attenuation/switching modules provides first step in a pathway of achieving improvement to provide optical devices suitable for next generation system applications. However, the irregularities of the supporting structure for a free standing membrane caused by the ineffectiveness of the stop etching configuration due to sacrificial layer undercut in the membrane forming processes often limit the applications and production yields when such technologies are applied.

Therefore, a still need exists in the art in the field of the optical signal transmission systems to provide a configuration and method of manufacture to overcome such difficulties and limitations. It is desirable that such method can provide simplified manufacturing processes such that cost reduction and production yields together with the product reliability can be improved. In addition, it is further desired that more process control can be provided for more precisely controlling the manufacturing processes to produce optical devices with size and dimensions with better controlled accuracy.

SUMMARY OF THE PRESENT INVENTION

It is therefore an object of the present invention to provide new and improved configuration and methods for manufacturing optical devices to substantially eliminate the etching irregularities caused by undercuts such that the problems and difficulties as encountered in the prior art may be resolved.

Specifically, it is the object of this invention to provide new and improved manufacture methods and configurations to form well-defined regions on sacrificial layer by applying different types of ion-implantation to form etch-enhanced and resistant regions. Free-standing membrane can be formed by etching through an etching window on top of etching enhancement region surrounded by etch-resistant region such that chamber can be formed by removing the etch-enhancement regions with precisely controllable chamber formation processes. The optical chambers are formed with well-defined wall where the undercut irregularities can be substantially removed.

Briefly, in a preferred embodiment, this invention discloses an electro-optical device support on a substrate. The electro-optical device includes a sacrificial layer disposed on the substrate having a chamber-wall region surrounding and defining an optical chamber. The electro-optical device further includes a membrane layer disposed on top of the sacrificial layer having a chamber-removal opening surrounding and defining an electric tunable membrane for transmitting an optical signal therethrough. The electrically tunable membrane disposed on top of the optical chamber surrounded by the chamber wall regions. The chamber-wall region is doped with ion-dopants for maintaining the chamber-wall region for removal-resistance under a chamber-forming process performed through the chamber-removal opening. In a preferred embodiment, the chamber-wall region is a doped silicon dioxide region with carbon or nitrogen. In another preferred embodiment, the chamber-wall region is a nitrogen ion-doped SiNxOy region. In another preferred embodiment, the optical chamber is an etched chamber formed by etching through the chamber removal opening for etching off an etch-enhanced region surrounded by an etch-resistant region constituting the chamber wall.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 2A-1 to 2J-2 are a series of cross sectional and top views for illustrating the processing sequence in manufacturing an optical device according a method of this invention.

DETAILED DESCRIPTION OF THE PREFERRED EMBODIMENT

Figure 1A:
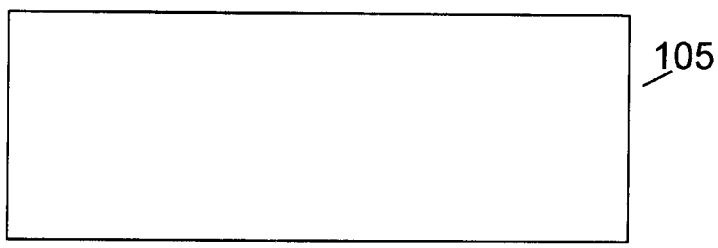
FIGS. 1A to 1I are a series of cross sectional views for illustrating the processing sequence in manufacturing an optical device according a method of this invention.
Figure 1B:
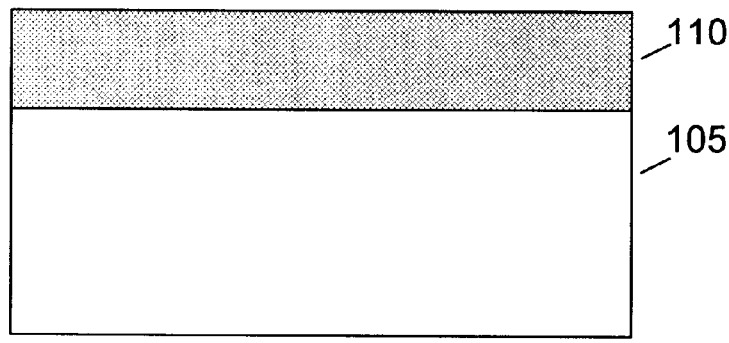
Figure 1C:
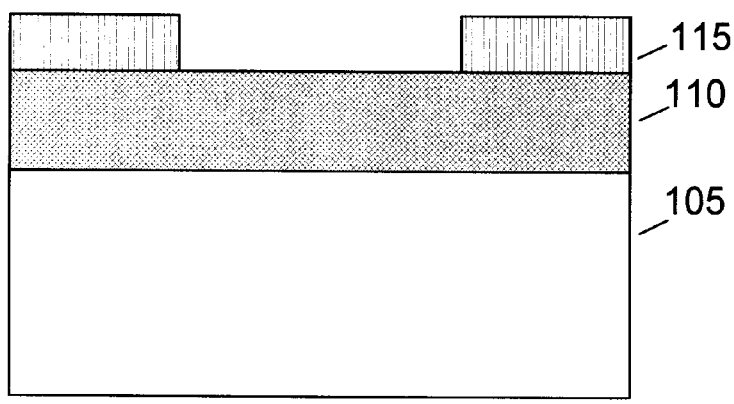
Figure 1D:
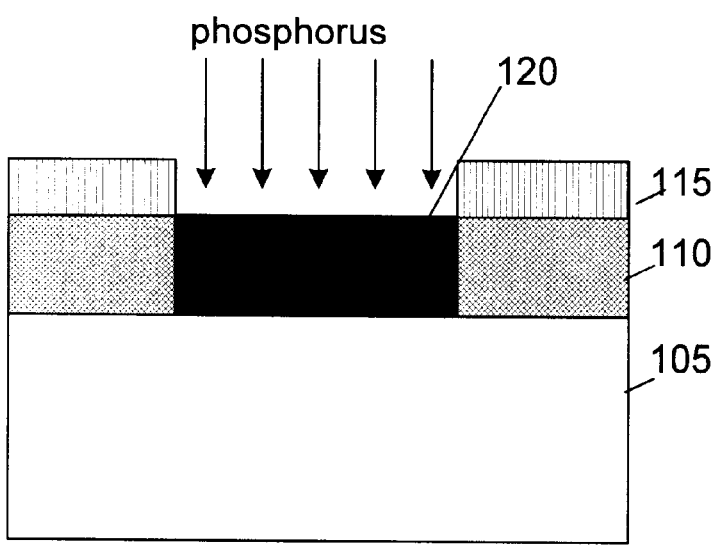
Figure 1E:
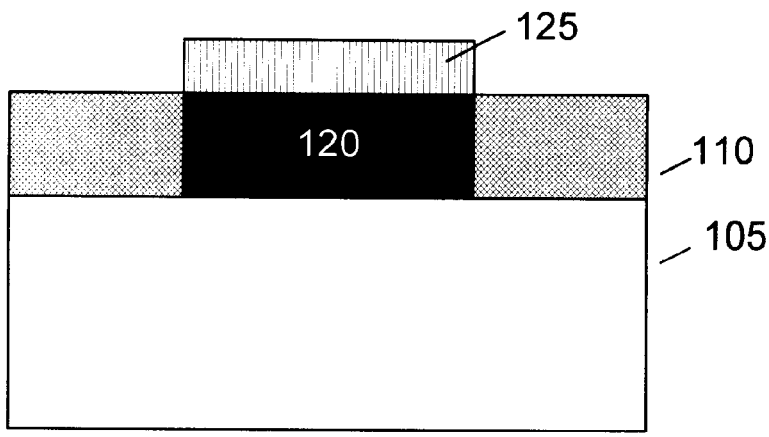
Figure 1F:
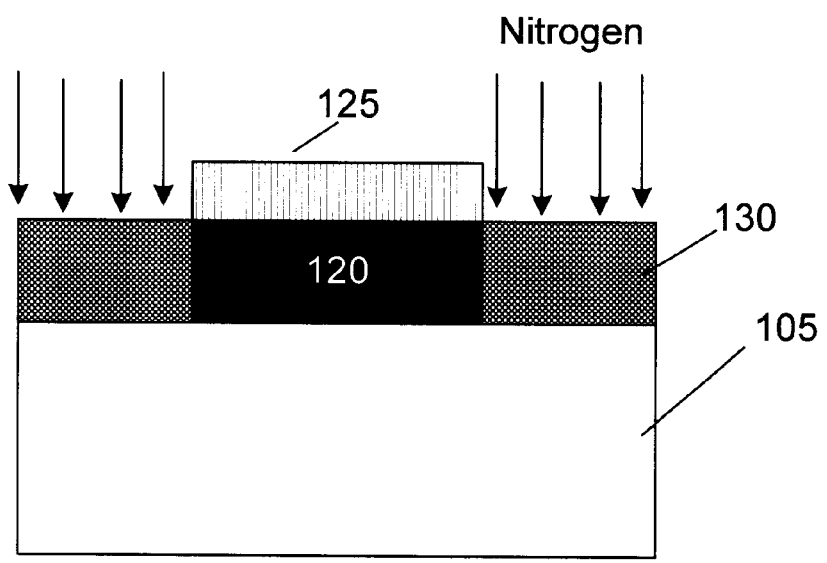
Figure 1G:
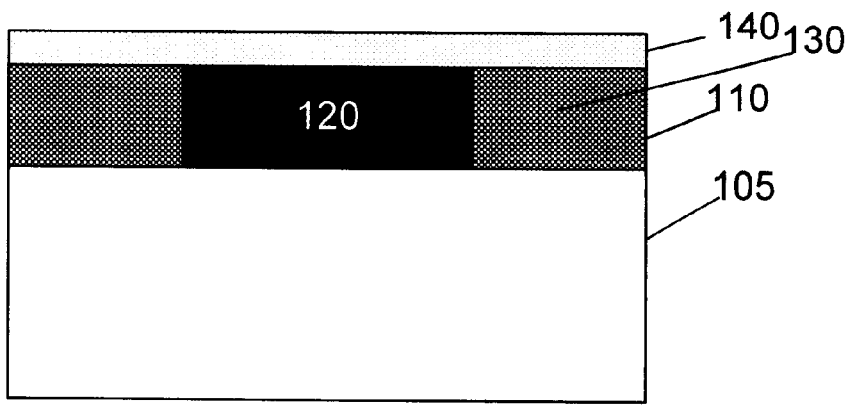

Referring to FIGS. 1A to 1I for a series of cross sectional views for showing the manufacturing processes of an optical device 100 with an electrically tunable membrane formed on top of an optical chamber. The process begins by providing a substrate 105 that may be an n-type silicon substrate (FIG. 1A). A sacrificial layer 110 composed of silicon dioxide is formed on top of the substrate 105 (FIG. 1B). A pattern mask 115 with opening is applied to define a sacrificial area to form an optical chamber (FIG. 1C). A phosphorous ion implantation is performed to form a chamber-forming enhancement region 120 (FIG. 1D). Then the first pattern mask 115 is removed and a second pattern mask 125 is employed on top of the sacrificial layer 110 covering the chamber-forming enhancement region 120 (FIG. 1E). A nitrogen ion implantation is performed to form the chamber-wall region 130 (FIG. 1F). The chamber-wall region 130 composed of silicon nitride (SiNxOy) that is generally etching resistant. The second pattern mask 125 is removed and a membrane layer 140 is then formed on top of the sacrificial layer 110 (FIG. 1G). An etching window 145 is formed (FIG. 1H) on the membrane layer surrounding and defining a membrane 150. An etch process is performed through the etching window 145 to etch off the chamber-forming enhancement region 120 while the etching-resistant chamber wall region 130 is maintained for surrounding and defining an optical chamber 120' disposed underneath the membrane 150.

Figure 1H:
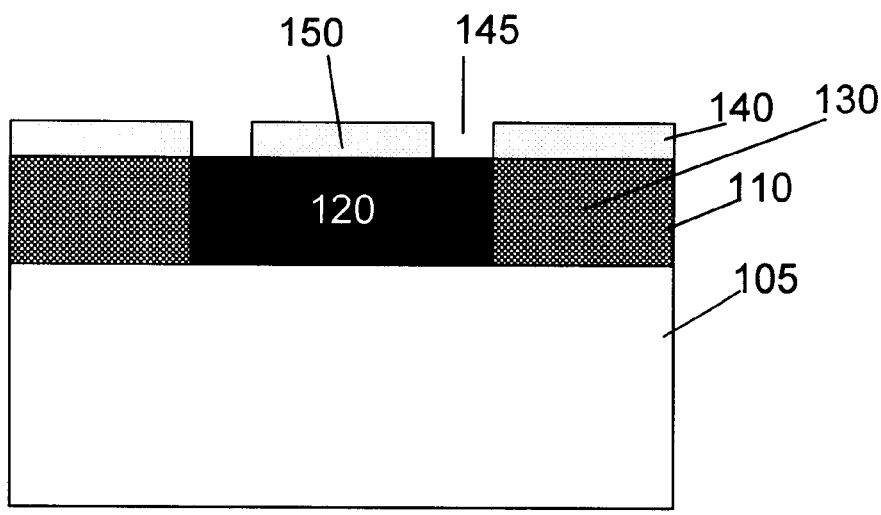
Figure 1I:
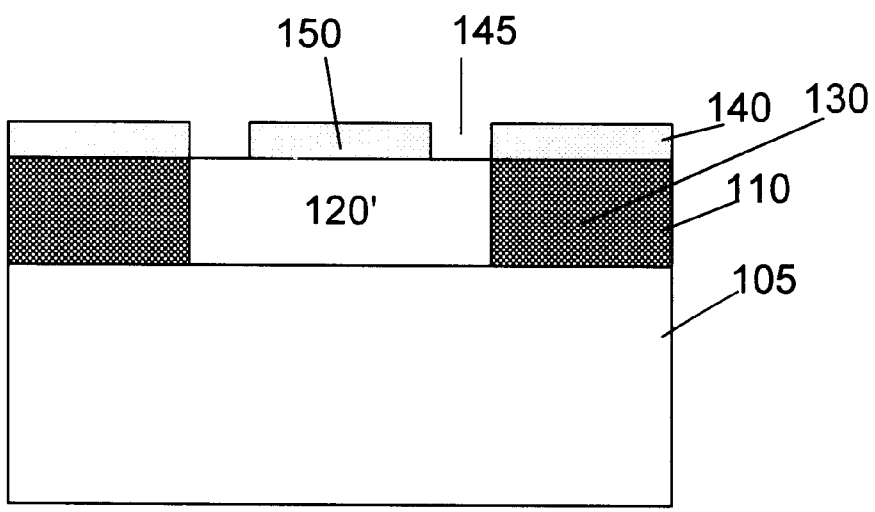

According to above descriptions and FIGS. 1A to 1I, this invention discloses an electro-optical device support on a substrate. The optical device includes a sacrificial layer 110 disposed on the substrate 105 having a chamber-wall region 130 surrounding a chamber region 120. The chamber-wall region 130 and the chamber region 120 are doped with different ion-dopants provided for removing the chamber region 120 and maintaining the chamber-wall region 130 in a chamber forming process. The optical device further includes a membrane layer 140 disposed on top of the sacrificial layer 110 having a chamber-removal opening 145 surrounding and defining an electric tunable membrane 150 for transmitting an optical signal therethrough. The electrically tunable membrane 150 disposed on top of the chamber region 120 surrounded by the chamber wall regions 130 (FIG. 1H). In a preferred embodiment, the optical device further includes an optical chamber 120' disposed underneath the electrically tunable membrane 150 formed by removing the chamber region 120 surrounded by the chamber-wall region 130 (FIG. 1I). In another preferred embodiment, the chamber-wall region 130 in the sacrificial layer 110 is doped with ion-dopants of a first conductivity and the chamber region 120 in the sacrificial layer is doped with ion-dopants of a second conductivity opposite the first conductivity. In another preferred embodiment, the chamber-wall region 130 in the sacrificial layer 110 is doped with ion-dopants to produce an etching resist region and the chamber region 120 in the sacrificial layer is doped with ion-dopants to produce an etching enhanced region. In another preferred embodiment, the chamber-wall region 130 in the sacrificial layer is doped with a ion-dopants of nitrogen or carbon and the chamber region 120 in the sacrificial layer is doped with ion-dopants of phosphorus or boron/phosphorous. In another preferred embodiment, the chamber-wall region 130 in the sacrificial layer is doped with phosphorus ion-dopants and the chamber region in the sacrificial layer is doped with nitrogen ion-dopants.

In essence, this invention discloses an electro-optical device support on a substrate. The electro-optical device includes a sacrificial layer 110 disposed on the substrate 105 having a chamber-wall region 130 surrounding and defining an optical chamber 120'. The electro-optical device further includes a membrane layer 140 disposed on top of the sacrificial layer 110 having a chamber-removal opening 145 surrounding and defining an electric tunable membrane 150 for transmitting an optical signal therethrough. The electrically tunable membrane 150 disposed on top of the optical chamber 120' surrounded by the chamber wall regions 130. The chamber-wall region 130 is doped with ion-dopants for maintaining the chamber-wall region for removal-resistance under a chamber-forming process performed through the chamber-removal opening 145. In a preferred embodiment, the chamber-wall region is an etch-resistant ion doped silicon dioxide region. In another preferred embodiment, the chamber-wall region is a nitrogen ion-doped SiNxOy region. In another preferred embodiment, the optical chamber 120' is an etched chamber formed by etching through the chamber removal opening 145.

Figures 1, 2I:
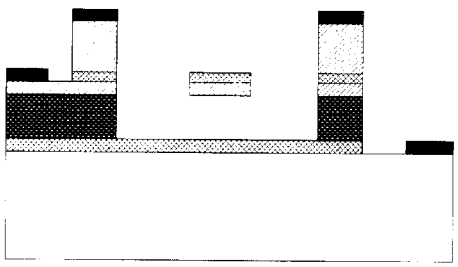
Figures 2, 2I:
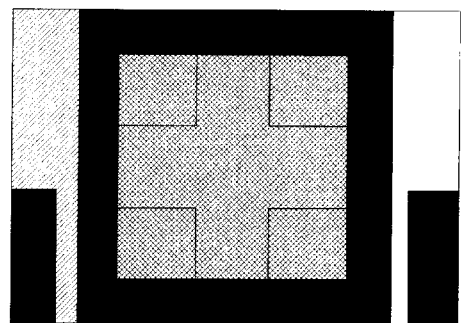
Figures 1, 2J:
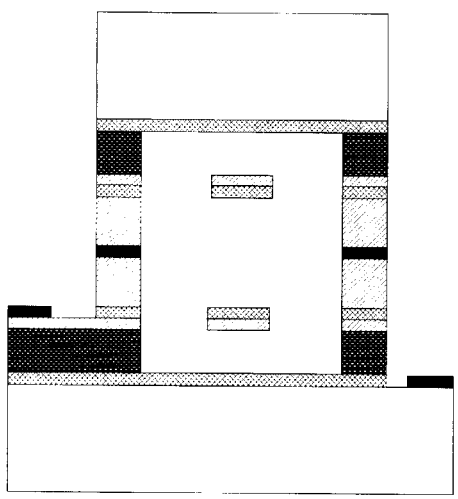
Figures 2, 2J:
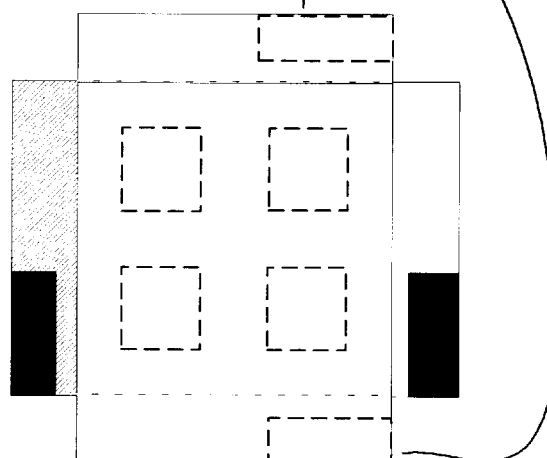

Referring now to FIGS. 2A-1 to 2J-1 for a series of side cross-sectional views and FIGS. 2A-2 to 2J-2 for a series of side top views for showing the manufacturing process to form an optical device according to the methods disclosed in this invention. The manufacturing processes begin with preparing and polishing a n-type substrate 205 (FIGS. 2A-1 and 2A-2). As that described in FIGS. 1D and 1E, a chamber-region mask 211 is employed for carrying out a phosphorus implantation to form a chamber-region 215-C (FIG. 2A-3). The chamber-region mask 211 is removed and a chamber-wall region mask 212 is employed for carrying out a nitrogen ion-dopant implantation to form chamber-wall regions 215-W for surrounding the chamber region 215-C (FIG. 2A-4). The above processes are part of a film stacking process that is carried out for sequentially depositing an antireflection layer 210, a sacrificial layer 215, a multiple-layered membrane layer 220, a spacer layer 225 and a bonding ring 230 (FIGS. 2B-1 and 2B-2).

A backside strip operation is performed to strip the metal layer formed on the backside (FIGS. 2C-1 and 2C-2). A first pattern mask (not shown) is applied to etch of a top portion of spacer layer 225 to open a first electrode window through an exposed top surface 220-E of the membrane layer 220 (FIGS. 2D-1 and 2D-2). A second pattern mask (not shown) is applied to etch of a top portion of spacer layer 225, a membrane layer 220 and a sacrificial layer 215 to open a second electrode window through an exposed top surface 205-E of the substrate layer 205 (FIGS. 2E-1 and 2E-2). A metallization process is carried out to form electrodes 235-1 and 235-2 on the exposed top surfaces 220-E and 205-E respectively (FIGS. 2F-1 and 2F-2). A third pattern mask (not shown) is employed to open a spacer window 225-1 on the spacer layer 225 (FIGS. 2G-1 and 2G-2). A fourth pattern mask (not shown) is employed to open an etch-window 215-1 on the membrane and sacrificial layer 215 (FIGS. 2H-1 and 2H-2). An optical chamber etch process is performed through the etch-window 215-1 for removing the chamber-region 215-C while the chamber wall region 215-W is a etch resistant region to form chamber wall surrounding the chamber 215-C'. As the chamber region 210-C is etched off, the freestanding membrane 220-M is formed on top of the chamber 215-C' (FIGS. 2I-1 and 2I-2).

As illustrated, the substrate 205 supported multiple side-by-side devices manufactured according to the above sequences of processing steps (only two side-by-side devices are shown for illustration). The substrate has scribe lines 240 between each individual device. Two side-by-side devices are then separated at the scribe line 240 and one of the devices is rotated by ninety-degrees for stacking on top of a bottom device with the electrodes stacking together. Two membranes 220-M-1 and 220-M-2 are stacked with a face-to-face configuration thus forming a resonator chamber with a gap between these membranes (FIGS. 2J-1 and 2J-2). Since these two optical devices are manufactured by as device of a same batch using identical set processing steps, the membranes 220-M-1 and 220-M-2 has identical reflection rate thus the insertion loss is minimized.

An electro-optical device support on a substrate is disclosed in this invention. The electro-optical device includes a sacrificial layer disposed on the substrate having a chamber-wall region surrounding a chamber region wherein the chamber-wall region and the chamber region are doped with different ion-dopants provided for removing the chamber region and maintaining the chamber-wall region in a chamber forming process. The device further includes a membrane layer disposed on top of the sacrificial layer having a chamber-removal opening surrounding and defining an electric tunable membrane for transmitting an optical signal therethrough wherein the electrically tunable membrane disposed on top of the chamber region surrounded by the chamber wall regions. In another preferred embodiment, the device further includes an optical chamber disposed underneath the electrically tunable membrane formed by removing the chamber region surrounded by the chamber-wall region. In another preferred embodiment, the chamber-wall region in the sacrificial layer is doped with ion-dopants of a first conductivity and the chamber region in the sacrificial layer is doped with ion-dopants of a second conductivity opposite the first conductivity. In another preferred embodiment, the chamber-wall region in the sacrificial layer is doped with ion-dopants to produce an etching resist region and the chamber region in the sacrificial layer is doped with ion-dopants to produce an etching enhanced region. In another preferred embodiment, the chamber-wall region in the sacrificial layer is doped with a N-type ion-dopants and the chamber region in the sacrificial layer is doped with P-type ion-dopants.

According to above descriptions and FIGS. 1 and 2, this invention further discloses a method for manufacturing an electro-optical device support on a substrate. The method includes steps of: A) Forming a sacrificial layer on the substrate having a chamber-wall region surrounding a chamber region by doping the chamber-wall region and the chamber region with different ion-dopants for removing the chamber region and maintaining the chamber-wall region in a chamber forming process. And, B) forming a membrane layer on top of the sacrificial layer with a chamber-removal opening surrounding for defining an electric tunable membrane on top of the chamber region surrounded by the chamber wall regions for transmitting an optical signal therethrough. In a preferred embodiment, the method further includes a step of removing the chamber region surrounded by the chamber-wall region for forming an optical chamber underneath the electrically tunable membrane. In another preferred embodiment, the step of forming the chamber-wall region in the sacrificial layer is a step of doping the chamber-wall region with ion-dopants of a first conductivity and doping the chamber region in the sacrificial layer with ion-dopants of a second conductivity opposite the first conductivity. In another preferred embodiment, the step of forming the chamber-wall region in the sacrificial layer is a step of doping the chamber-wall region with ion-dopants to produce an etching resist region and doping the chamber region in the sacrificial layer with ion-dopants to produce an etching enhanced region. In another preferred embodiment, the step of forming the chamber-wall region in the sacrificial layer is a step of doping the chamber-wall region with a N-type ion-dopants and doping the chamber region in the sacrificial layer with P-type ion-dopants. In another preferred embodiment, the step of forming the chamber-wall region in the sacrificial layer is a step of doping the chamber-wall region with a P-type ion-dopants and doping the chamber region in the sacrificial layer with N-type ion-dopants.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. An electro-optical device support on a substrate comprising:

a sacrificial layer disposed on said substrate having a chamber-wall region surrounding a chamber region wherein said chamber-wall region and said chamber region are doped with different ion-dopants provided for removing said chamber region and maintaining said chamber-wall region in a chamber forming process; and a membrane layer disposed on top of said sacrificial layer having a chamber-removal opening surrounding and defining an electric tunable membrane for transmitting an optical signal therethrough wherein said electrically tunable membrane disposed on top of said chamber region surrounded by said chamber wall regions.

2. The electro-optical device of claim 1 further comprising:

an optical chamber disposed underneath said electrically tunable membrane formed by removing said chamber region surrounded by said chamber-wall region.

3. The electro-optical device of claim 1 wherein:

said chamber-wall region in said sacrificial layer is doped with ion-dopants of a first conductivity and said chamber region in said sacrificial layer is doped with ion-dopants of a second conductivity opposite said first conductivity.

4. The electro-optical device of claim 1 wherein:

said chamber-wall region in said sacrificial layer is doped with ion-dopants to produce an etching resist region and said chamber region in said sacrificial layer is doped with ion-dopants to produce an etching enhanced region.

5. The electro-optical device of claim 1 wherein:

said chamber-wall region in said sacrificial layer is doped with a N-type ion-dopants and said chamber region in said sacrificial layer is doped with P-type ion-dopants.

6. The electro-optical device of claim 4 wherein:

said chamber-wall region in said sacrificial layer is doped with a nitrogen ion-dopants.

7. The electro-optical device of claim 4 wherein:

said chamber-wall region in said sacrificial layer is doped with a carbon ion-dopants.

8. The electro-optical device of claim 4 wherein:

said chamber region in said sacrificial layer is doped with phosphorus ion-dopants.

9. The electro-optical device of claim 4 wherein:

said chamber region in said sacrificial layer is doped with phosphorus/boron ion-dopants.

10. The electro-optical device of claim 1 wherein:

said chamber-wall region in said sacrificial layer is doped with a P-type ion-dopants and said chamber region in said sacrificial layer is doped with N-type ion-dopants.

11. The electro-optical device of claim 4 wherein:

said chamber-wall region in said sacrificial layer is doped with phosphorous ion-dopants.

12. The electro-optical device of claim 4 wherein:

said chamber-wall region in said sacrificial layer is doped with phosphorous/boron ion-dopants.

13. The electro-optical device of claim 4 wherein:

said chamber-wall region in said sacrificial layer is doped with nitrogen ion-dopants.

14. The electro-optical device of claim 1 wherein:

said chamber-wall region in said sacrificial layer is doped with carbon ion-dopants.

15. An electro-optical device support on a substrate comprising:

a sacrificial layer disposed on said substrate having a chamber-wall region surrounding and defining an optical chamber; and a membrane layer disposed on top of said sacrificial layer having a chamber-removal opening surrounding and defining an electric tunable membrane for transmitting an optical signal therethrough wherein said electrically tunable membrane disposed on top of said optical chamber surrounded by said chamber wall regions wherein said chamber-wall region is doped with ion-dopants for maintaining said chamber-wall region for removal-resistance under a chamber-forming process performed through said chamber-removal opening.

16. The electro-optical device of claim 15 wherein:

said chamber-wall region is a N-type doped silicon dioxide region.

17. The electro-optical device of claim 15 wherein:

said chamber-wall region is a nitrogen doped silicon dioxide region.

18. The electro-optical device of claim 15 wherein:

said chamber-wall region is a carbon doped silicon dioxide region.

19. The electro-optical device of claim 15 wherein:

said chamber-wall region is a nitrogen ion-doped SiNxOy region.

20. The electro-optical device of claim 15 wherein:

said optical chamber is an etched chamber formed by etching through said chamber removal opening.

21. A method for manufacturing an electro-optical device support on a substrate comprising:

a) forming a sacrificial layer on said substrate having a chamber-wall region surrounding a chamber region by doping said chamber-wall region and said chamber region with different ion-dopants for removing said chamber region and maintaining said chamber-wall region in a chamber forming process; and b) forming a membrane layer on top of said sacrificial layer with a chamber-removal opening surrounding for defining an electric tunable membrane on top of said chamber region surrounded by said chamber wall regions for transmitting an optical signal therethrough.

22. The method of claim 21 further comprising:

removing said chamber region surrounded by said chamber-wall region for forming an optical chamber underneath said electrically tunable membrane.

23. The method of claim 21 wherein:

said step of forming said chamber-wall region in said sacrificial layer is a step of doping said chamber-wall region with ion-dopants of a first conductivity and doping said chamber region in said sacrificial layer with ion-dopants of a second conductivity opposite said first conductivity.

24. The method of claim 21 wherein:

said step of forming said chamber-wall region in said sacrificial layer is a step of doping said chamber-wall region with ion-dopants to produce an etching resist region and doping said chamber region in said sacrificial layer with ion-dopants to produce an etching enhanced region.

25. The method of claim 21 wherein:

said step of forming said chamber-wall region in said sacrificial layer is a step of doping said chamber-wall region with a N-type ion-dopants and doping said chamber region in said sacrificial layer with P-type ion-dopants.

26. The method of claim 21 wherein:

said step of forming said chamber-wall region in said sacrificial layer is a step of doping said chamber-wall region with a P-type ion-dopants and doping said chamber region in said sacrificial layer with N-type ion-dopants.

* * * * *